(12) United States Patent
Li

(10) Patent No.: US 10,651,406 B2
(45) Date of Patent: May 12, 2020

(54) MANUFACTURING METHOD OF FLEXIBLE OLED PANEL, FLEXIBLE OLED DISPLAY PANEL, AND DISPLAY

(71) Applicant: Wuhan China Star Optoelectronics Semiconductor Display Technology Co., Ltd., Wuhan, Hubei (CN)

(72) Inventor: Peng Li, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/961,412

(22) Filed: Apr. 24, 2018

(65) Prior Publication Data

US 2019/0214586 A1    Jul. 11, 2019

Related U.S. Application Data

(63) Continuation of application No. PCT/CN2018/073841, filed on Jan. 23, 2018.

(30) Foreign Application Priority Data

Jan. 5, 2018  (CN) .......................... 2018 1 0013178

(51) Int. Cl.
*H01L 27/32* (2006.01)
*H01L 51/00* (2006.01)
(Continued)

(52) U.S. Cl.
CPC ...... *H01L 51/0097* (2013.01); *H01L 27/3244* (2013.01); *H01L 51/003* (2013.01); *H01L 51/5237* (2013.01); *H01L 51/56* (2013.01)

(58) Field of Classification Search
CPC ............ H01L 27/3244; H01L 51/0097; H01L 51/5237
(Continued)

(56) References Cited

U.S. PATENT DOCUMENTS

2017/0062532 A1*  3/2017  Jeong .................. H01L 27/3246

FOREIGN PATENT DOCUMENTS

| CN | 106486491 A | 3/2017 |
| CN | 106992263 A | 7/2017 |

(Continued)

OTHER PUBLICATIONS

International Search Report in Application No. PCT/CN2018/073841, 9PP.

*Primary Examiner* — Long K Tran
(74) *Attorney, Agent, or Firm* — Hemisphere Law, PLLC; Zhigang Ma

(57) ABSTRACT

A manufacturing method of a flexible OLED panel, a flexible OLED panel, and a display is disclosed. The flexible OLED panel is manufactured by the manufacturing method, and the display includes the flexible OLED panel. The disclosure functions as a role of blocking crack diffusion by forming the opening holes in the inorganic layer to release the cracking stress; the opening holes are arranged in at least two rows, and two of the rows of the opening holes adjacent to each other are arranged in a dislocation manner in the surrounding direction so as to distribute at least one of the opening holes on a line connecting any position on the boundary of the second area away from the first area to any position of the display area, the diffusion of cracks at any position in the inorganic layer can be blocked by at least one of the opening holes.

8 Claims, 6 Drawing Sheets

(51) Int. Cl.
*H01L 51/52* (2006.01)
*H01L 51/56* (2006.01)

(58) Field of Classification Search
USPC .......................................................... 257/40
See application file for complete search history.

(56) References Cited

FOREIGN PATENT DOCUMENTS

WO     2016/204121 A1    12/2016
WO     2017/113256 A1    7/2017

\* cited by examiner

MANUFACTURING METHOD OF FLEXIBLE OLED PANEL, FLEXIBLE OLED DISPLAY PANEL, AND DISPLAY

RELATED APPLICATIONS

This application is a continuation application of PCT Patent Application No. PCT/CN2018/073841, filed Jan. 23, 2018, which claims the priority benefit of Chinese Patent Application No. 201810013178.8, filed Jan. 5, 2018, which is herein incorporated by reference in its entirety.

FIELD OF THE DISCLOSURE

The disclosure relates to the technical field of display panels, and in particular to a manufacturing method of a flexible OLED panel, a flexible OLED panel, and a display.

BACKGROUND

The LLO (Laser lift off) process is one of the key manufacturing processes of a flexible OLED (Organic Light-Emitting Diode) panel.

The flexible OLED panel includes a display area and a frame area. When the LLO process is performed, the frame area may crack. The cracks will continue to spread over time and eventually spread to the display area, affecting the normal display of the display area.

SUMMARY

In view of this, the disclosure provides a manufacturing method of a flexible OLED panel, a flexible OLED panel, and a display, which can avoid defects that affect the normal display due to cracks in the frame area.

A manufacturing method of a flexible OLED panel is disclosed, including: providing a rigid substrate, fabricating a flexible base substrate, a first inorganic layer, a TFT device, a second inorganic layer, an OLED device, and an encapsulation layer on the rigid substrate to form a first flexible large OLED panel. Here, the first inorganic layer is formed on the flexible base substrate and a semiconductor layer of the TFT device; the second inorganic layer covers the semiconductor layer, a gate of the TFT device and the first inorganic layer, a source and a drain of the TFT device both penetrate the second inorganic layer and are connected to the semiconductor layer, and the second inorganic layer is isolated from the gate, the source, and the drain; the OLED device is formed on the TFT device, and the encapsulation layer encapsulates the OLED device and the TFT device for encapsulation; the first flexible large OLED panel includes a display area, a frame area surrounding a periphery of the display area, and a cutting area surrounding the frame area, the frame area includes a first area and a second area connected to each other, and a side of the first area away from the second area is connected to the display area; the TFT device and the encapsulation layer are both distributed in the display area and the first area; the OLED device is distributed in the display area; the rigid substrate, the flexible base substrate, and the first inorganic layer are all distributed in the display area, the first area, the second area edge, and the cutting area; and the second inorganic layer is distributed at least in the display area, the first area, and the second area; forming at least two rows of opening holes in a portion of the second inorganic layer located in the second area, and a connection line of each of the opening holes of each of the rows extends in a surrounding direction of the frame area, and two of the rows of the opening holes adjacent to each other are arranged in a dislocation manner in the surrounding direction so as to distribute at least one of the opening holes on a line connecting any position on a boundary between the second area and the cutting area to any position of the display area; cutting the cutting area in the first large OLED panel to obtain a second flexible large OLED panel; and removing the rigid substrate in the second flexible large OLED panel by using a LLO technique.

In the step of forming at least two rows of opening holes in a portion of the second inorganic layer located in the second area, each of the opening holes of each of the rows is arranged at intervals from each other, in two of the rows of the opening holes adjacent to each other, at least one of the opening holes of one of the rows is distributed between each two of the opening holes adjacent to each other of another one of the rows.

In the step of providing at least two rows of opening holes in a portion of the second inorganic layer located in the second area, each of the opening holes in each row is connected in sequence, in two of the rows of the opening holes adjacent to each other, at least one of the opening holes of one of the rows is distributed between each two of the opening holes adjacent to each other of another one of the rows.

In the step of forming at least two rows of the opening holes in a portion of the second inorganic layer located in the second area, the at least two rows of the opening holes form a plurality of X-shaped patterns sequentially connected to each other.

Each of the opening holes penetrates only the second inorganic layer or penetrates the second inorganic layer and a part of the first inorganic layer.

A flexible OLED panel includes a display area and a frame area surrounding a periphery of the display area. The frame area includes a first area and a second area connected to each other, and a side of the first area away from the second area is connected to the display area. The flexible OLED panel includes a flexible base substrate and an inorganic layer disposed on the flexible base substrate, the flexible base substrate and the inorganic layer are both distributed in the display area, the first area, and the second area. At least two rows of the opening holes are formed in a portion of the inorganic layer located in the second area, and a connection line of each of the opening holes of each of the rows extends in a surrounding direction of the frame area and two of the rows of the opening holes adjacent to each other are arranged in a dislocation manner in the surrounding direction so as to distribute at least one of the opening holes on a line connecting any position on the boundary of the second area away from the first area to any position of the display area.

Each of the opening holes of each of the rows is arranged at intervals from each other; and at least one of the opening holes of one of the rows is distributed between each two of the opening holes adjacent to each other of another one of the rows.

Each of the opening holes in each row is connected in sequence; and at least one of the opening holes of one of the rows is distributed between each two of the opening holes adjacent to each other of another one of the rows.

The at least two rows of the opening holes form a plurality of X-shaped patterns sequentially connected to each other.

A display includes the flexible OLED panel.

In the proposal of the disclosure, the opening holes are firstly formed in a portion of the second inorganic layer located in the second area, and then the LLO process is performed. Even though the crack will still occur during the LLO process, the crack can be prevented from being spread when reaching the opening holes due to the opening holes may release the cracking stress of the second inorganic layer, so that the defect of the crack may be prevented from being spread from the frame area to the display area. That is, the opening holes function as a role of blocking the crack diffusion by releasing the cracking stress, and the opening holes are arranged in at least two rows, and two of the rows of the opening holes adjacent to each other are arranged in a dislocation manner in the surrounding direction so as to distribute at least one of the opening holes on a line connecting any position on the boundary of the second area away from the first area to any position of the display area, the diffusion of the cracks at any position in the inorganic layer can be blocked by at least one of the opening holes, thereby ensuring the crack at any position are not spread to the display area, improving the manufacturing yield of the flexible OLED panel and enhancing the reliability of the flexible OLED panel.

BRIEF DESCRIPTION OF THE DRAWINGS

The following sections offer a clear, complete description of the disclosure in combination with the embodiments and accompanying drawings. Obviously, the embodiments described herein are only a part of, but not all of the embodiments of the disclosure. In view of the embodiments described herein, any other embodiment obtained by the person skilled in the field without offering creative effort is included in a scope claimed by the disclosure.

DETAILED DESCRIPTION OF PREFERRED EMBODIMENTS

Figure 1:
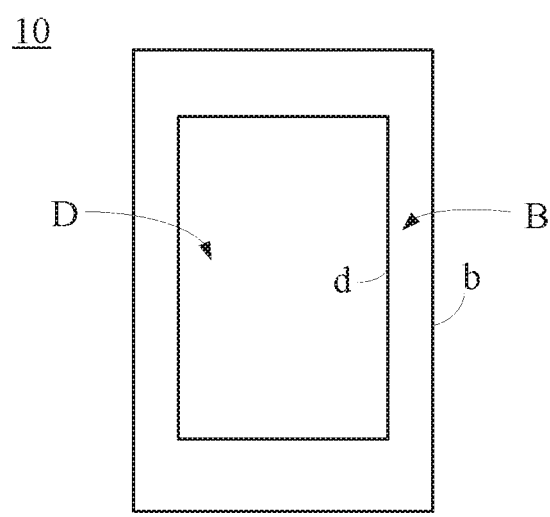
FIG. 1 is a schematic front view of a structure of a flexible OLED panel according to an embodiment of the disclosure.

The following sections offer a clear, complete description of the disclosure in combination with the embodiments and accompanying drawings. Obviously, the embodiments described herein are only a part of, but not all of the embodiments of the disclosure. In view of the embodiments described herein, any other embodiment obtained by those of ordinary skill in the art skilled in this art without offering creative effort is included in a scope claimed by the disclosure.

The following description of various embodiments is made with reference to the accompanying drawings to illustrate specific embodiments in which the disclosure may be practiced. The directional terms used in this disclosure referred to, for example, "upper", "lower", "front", "rear", "left", "right", "inner", "outer", "side", etc., only is used to refer to the attached drawings. Therefore, the directional terms are used to better and clearly describe and understand the disclosure, but not to indicate or imply that devices or components must have a specific azimuth, or be constructed or operated in the specific azimuth, which thus cannot be understood as a limitation to the embodiments of the disclosure.

In the description of the disclosure, it is to be noted that, unless otherwise expressly specified or limited, the terms "mounted," "connected," "connected," "disposed on . . . " are to be broadly understood, for example, it may be a fixed connection, a detachably connection or a integral connection; it may be a mechanical connection; it may be directly connected or indirectly connected through an intermediary medium, and may be an internal communication between two elements. For those skilled in the art, the specific meanings of the terms in the disclosure may be understood based on specific situations.

In the description of the disclosure, the term "plurality" means "two or more", unless expressly specified otherwise. The phrase "process " appearing in this specification means not only an independent process but also a term that is intended to achieve the desired function of the process when it is not clearly distinguished from other processes. The numerical range denoted by "~" in this specification means a range including the numerical values described before and after "~" as the minimum value and the maximum value, respectively. In the drawings, elements that are similar in structure or the same are denoted by the same reference numerals.

An embodiment of the disclosure provides a manufacturing method of a flexible OLED panel, configured to manufacture a flexible OLED panel. Illustratively, the flexible OLED panel may be the flexible OLED panel 10 shown in FIG. 1, which includes a display area D and a frame area B surrounding the periphery of the display area D. The display area D is distributed with a display device configured to display a picture. The display area D has a boundary d (the boundary d is also a common boundary between the display area D and the frame area B). The frame area B is a non-display area and can be arranged with a driving circuit, a sealant, and the like. The frame area B has a boundary b, and the frame area B surrounds the outer periphery of the display area D one turn. Hereinafter, a manufacturing method of a flexible OLED panel according to an embodiment of the disclosure will be described in detail with reference to the accompanying drawings.

The manufacturing method of the flexible OLED panel of this embodiment includes the following steps:

1. Providing a rigid substrate;

2. Fabricating a flexible base substrate, a first inorganic layer, a TFT device, a second inorganic layer, an OLED device, and an encapsulation layer on the rigid substrate to form a first flexible large OLED panel. Here, the first inorganic layer is formed on the flexible base substrate and a semiconductor layer of the TFT device; the second inorganic layer covers the semiconductor layer, a gate of the TFT device and the first inorganic layer, a source and a drain of the TFT device both penetrate the second inorganic layer and are connected to the semiconductor layer, and the second inorganic layer is isolated from the gate, the source, and the drain; the OLED device is formed on the TFT device, the encapsulation layer encapsulates the OLED device and the TFT device for encapsulation; the first flexible large OLED panel includes a display area, a frame area surrounding a periphery of the display area, and a cutting area surrounding the frame area; the frame area includes a first area and a second area connecting to each other, a side of the first area away from the second area is connected to the display area, a side of the second area away from the first area is connected to the cutting area; the TFT device and the encapsulation layer are both distributed in the display area and the first area; the OLED devices are distributed in the display area; the first inorganic layer is distributed in the display area, the first area, the second area edge and the cutting area; and the second inorganic layer is distributed at least in the display area, the first area, and the second area;

3. At least two rows of the opening holes are formed in a portion of the second inorganic layer located in the second area, and a connection line of each of the opening holes of each of the rows extends in a surrounding direction of the frame area and two of the rows of the opening holes adjacent to each other are arranged in a dislocation manner in the surrounding direction so as to distribute at least one of the opening holes on a line connecting any position on a boundary between the second area and the cutting area to any position of the display area;

4. Cutting off the cutting area in the first flexible large OLED panel to obtain a second flexible large OLED panel;

5. Removing the rigid substrate in the second flexible large OLED panel by using a LLO technique.

Figure 2:
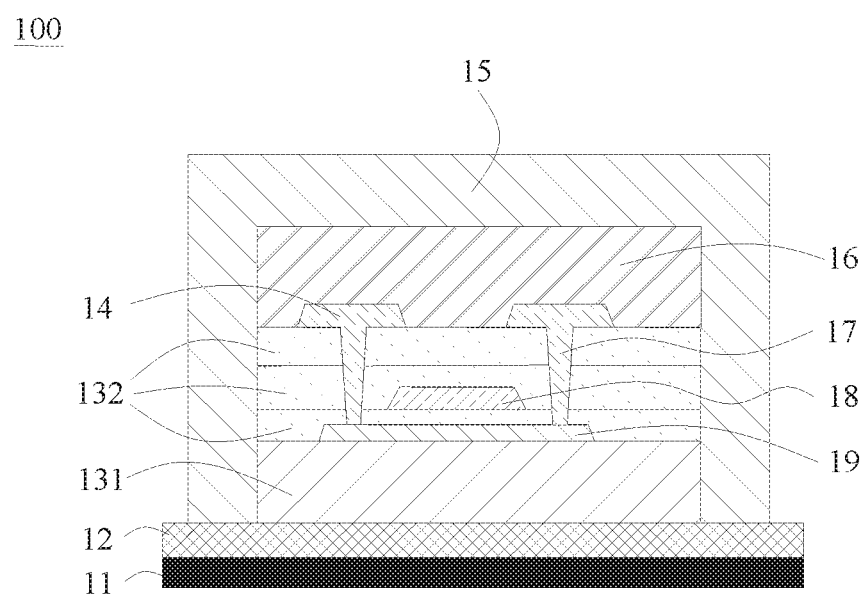
FIG. 2 is a schematic cross-sectional structure view of a first flexible large OLED panel formed in a manufacturing method according to an embodiment of the disclosure.

Specifically, as shown in FIG. 2, a rigid substrate 11 is provided in step 1. The rigid substrate 11 includes, but is not limited to, a glass substrate, which serves as a rigid carrier for the film layer formed in a subsequent step.

As shown in FIG. 2, in step 2, a flexible base substrate 12, a first inorganic layer 131, a TFT device, a second inorganic layer 132, an OLED device 16, and an encapsulation layer 15 are formed on the rigid substrate 11 to form a first flexible large OLED panel 100.

The flexible base substrate 12 includes, but is not limited to, a PI (Polyimide) film or other flexible bending-resistant film. The first inorganic layer 131 and the second inorganic layer 132 include, but are not limited to, a SiNx, SiOx, or SiNx+SiOx material layer. In this embodiment, the first inorganic layer 131 and the second inorganic layer 132 may both include a plurality of laminated inorganic material layers by multiple material depositions.

As shown in FIG. 2, the formed TFT device includes a semiconductor layer 19, a gate 18, a source 14, and a drain 17. The first inorganic layer 131 is formed between the flexible base substrate 12 and the semiconductor layer 19 of the TFT device for insulating and buffering. The second inorganic layer 132 is located on the first inorganic layer 131, and the second inorganic layer 132 covers the semiconductor layer 19, the gate 18 of the TFT device, and the first inorganic layer 131. Both the source 14 and the drain 17 penetrate the second inorganic layer 132 and are connected to the semiconductor layer 19 to be conducted through the semiconductor layer 19. The second inorganic layer 132 isolates the gate 18, the source 14, and the drain electrode 17 to ensure the normal performance of the TFT device.

As shown in FIG. 2, the OLED device 16 is located above the TFT device. It should be understood that a planarization layer may also be formed between the OLED device 16 and the TFT device to planarize the surface of the TFT device and facilitate the formation of the OLED device 16. The encapsulation layer 15 encapsulates the OLED device 16, the TFT device, the second inorganic layer 132, and the first inorganic layer 131, and functions as an encapsulating protection.

Figure 3:
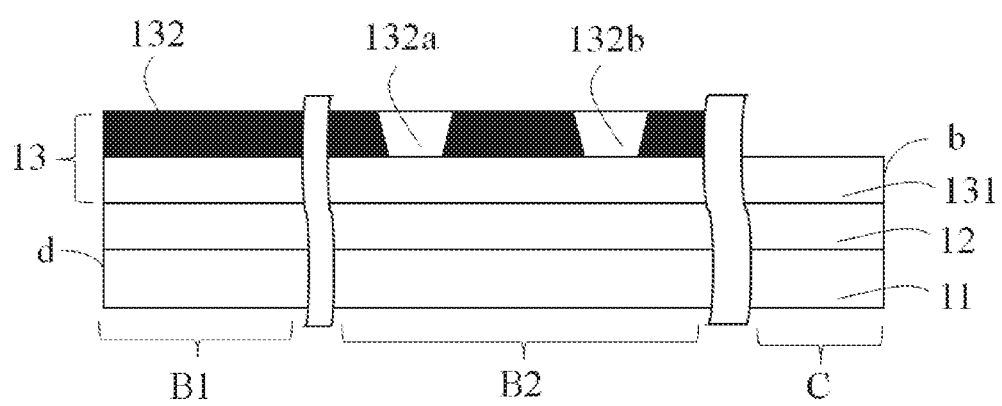
FIG. 3 is a schematic diagram of forming the opening holes in an inorganic layer in the manufacturing method according to the embodiment of the disclosure.

In this embodiment, as shown in FIG. 1 and FIG. 3, a display area may be formed in step 2, a frame area surrounding the periphery of the display area and a cutting area C surrounding the frame area (the display area is not shown in FIG. 3), the display area is the display area D of the OLED panel 10 as the final product, the frame area is the frame area B of the OLED panel 10 as the final product. Therefore, the display area is directly referred to the display area D and the frame area is referred to the frame area B. Forming the display area D and the frame area B is actually a process of forming the film layer, the device, the related supporting structure, the circuit structure, and the like through the patterning process. Once the display area D and the frame area B are formed, it means that the film, the device, the related support structure, the circuit structure, and the like located in the display area D and the frame area B are formed, thereby defining the display area D and the frame area B. The cutting area C is an area to be cut out in a cutting process (a process of cutting a large board into a panel).

As shown in FIG. 1 and FIG. 3, in step 2, in the direction of the outer edge of the frame area B to the display area D, the frame area B includes a second area B2 and a first area B1 connected to each other, a side of the second area B2 away from the first area B1 is connected to the cutting area C, a side of the first area away from the second area B2 and the display area are connected to cutting area C. It should be understood that FIG. 3 is only a partial cross-sectional schematic diagram of the frame area B and the cutting area C. Actually, the positional relationship between the cutting area C, the second area B2, and the first area B1 is a nested relationship from outside to inside. The first area B1 is adjacent to the display area D, it can also be seen from FIG. 3, the first area B1 is located at the innermost layer of the frame area B, the boundary d of the display area D is also the left boundary of the first area B1; the cutting area C is located at the periphery of the frame area B and the boundary b of the frame area B is also the left boundary of the cutting area C.

As shown in FIG. 3, in step 2, the rigid substrate 11, the flexible base substrate 12, the first inorganic layer 131 all cover the display area D, the first area B1, the second area B2, and the cutting area C. That is, each material layer in the rigid substrate 11, the flexible base substrate 12, and the first inorganic layer 131 has a distribution in the display area D, the first area B1, the second area B2, and the cutting area C. It should be understood that the display area D is not shown in FIG. 3, but in fact, the rigid substrate 11, the flexible base substrate 12, and the first inorganic layer 131 are also distributed in the display area D. The second inorganic layer 132 is distributed at least in the display area D, the first area B1, and the second area B2. That is, the second inorganic layer 132 may further be distributed in the cutting area C. The TFT device and the encapsulation layer 15 are all distributed in the display area D and the first area B1. The OLED device 16 is distributed in the display area D (the TFT device, the OLED device 16, and the encapsulation layer 15 are not shown in FIG. 3).

In this embodiment, a driving circuit such as a gate line and a data line of a TFT device can be disposed in the first area B1; the cutting area C can be removed as a cutting area in a subsequent step; and the second area B2 serves as a stress buffering region capable of buffering the stress in the frame area B when cutting the cutting area C (which will be described in detail later), and thus no device needs to be formed in the cutting area C and the second area B2.

Figure 4:
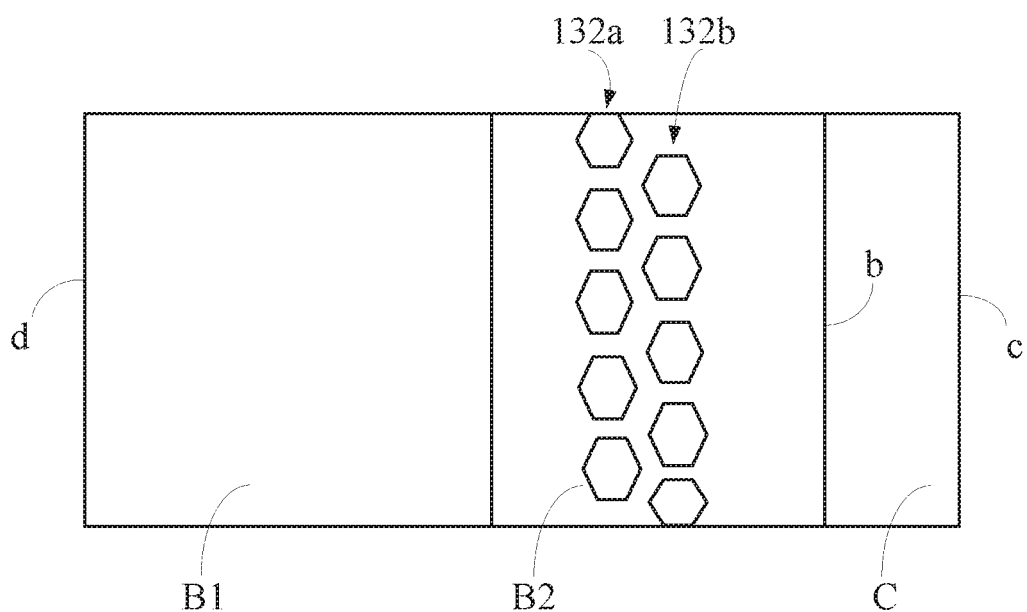
FIG. 4 is a schematic diagram of a distribution structure of the opening holes in the first embodiment of the disclosure.

In step 3, at least two rows of opening holes are formed in a portion of the second inorganic layer 132 located in the second area B2. For example, two rows of the opening holes 132a and 132b are schematically shown in FIGS. 3 and 4. A connection line of each of the opening holes of each of the rows extends in a surrounding direction of the frame area B, the surrounding direction is a direction of the frame area B surrounding the display area D, that is, a circumferential direction of the frame area B. Two of the rows of the opening holes adjacent to each other are arranged in a dislocation manner in the surrounding direction so as to distribute at least one of the opening holes on a line connecting any position on the boundary b of the second area B2 away from the first area B1 to any position of the display area D. In this embodiment, on the second inorganic layer 132, the opening holes 132a and 132b may be through holes or may be blind holes. Further, in the case of the through holes, each of the opening holes 132a and each of the opening holes 132b may only penetrate the second inorganic layer 132 or penetrate the second inorganic layer 132 and a part of the first inorganic layer 131 to prevent the flexible substrate 12 from being exposed to volatilize the organic substance to cause pollution.

Specifically, as shown in FIG. 4, in the first implementation of step 3, the two rows of the opening holes 132a and 132b may be formed, each of the opening holes 132a and 132b includes a plurality of opening holes arranged at intervals from each other. Further, one of the opening holes 132b is distributed between every two adjacent opening holes of the opening holes 132a while one of the opening holes 132a is distributed between every two adjacent opening holes of the opening holes 132b; as a result, at least an opening hole is distributed on a connecting line from any position on the boundary b to the display area D, so as to achieve the description of "two of the rows of the opening holes adjacent to each other are arranged in a dislocation manner in the surrounding direction so as to distribute at least one of the opening holes on a line connecting any position on the boundary of the second area away from the first area to any position of the display area". In this embodiment, the opening holes may be hexagons. Actually, the opening holes may also be other shapes, such as circles, squares, and the like. In other embodiments, two or more opening holes in the opening holes 132b (or opening holes 132a) may be distributed between every two adjacent opening holes in the opening holes 132a (or opening holes 132b), that is, the arrangement of the opening holes in the opening holes 132a (or the opening holes 132b) is sparser and the arrangement of the opening holes in the opening holes 132b (or the opening holes 132a) is denser.

Figure 5:
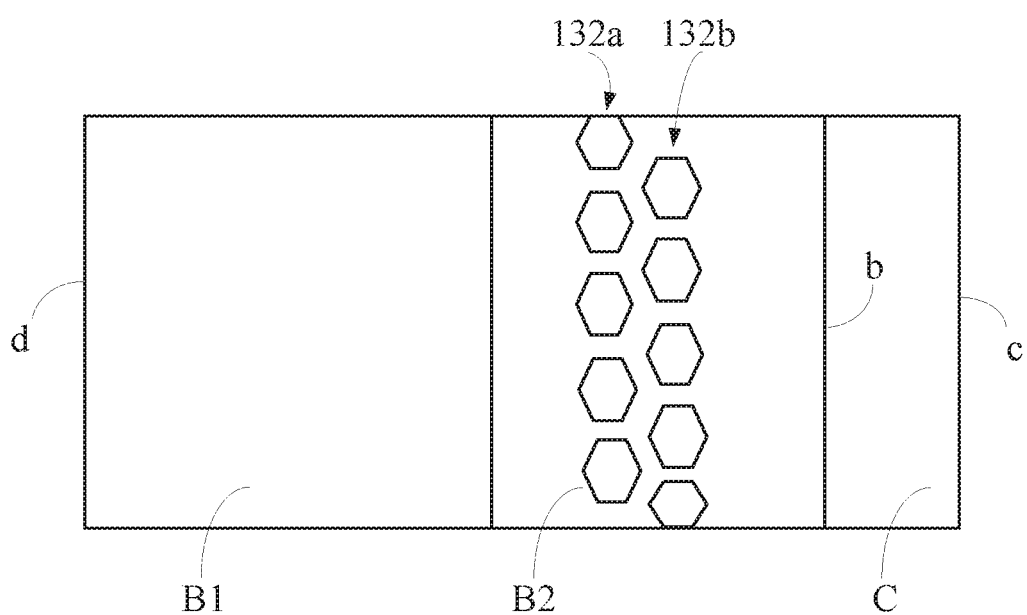
FIG. 5 is a schematic diagram of a distribution structure of the opening holes in the second embodiment of the disclosure.

Alternatively, as shown in FIG. 5, in the second implementation of step 3, two rows of the opening holes 232a and 232b may be formed. Different from the above embodiment, each of the opening holes 232a and 232b is sequentially connected, and one opening hole of the opening holes 232b is distributed between every two adjacent opening holes of the opening holes 232a while one opening hole of the opening holes 232a is distributed between every two adjacent opening holes of the opening holes 232b. In the present embodiment, the connection of the opening holes means that the opening holes are connected to each other. In other embodiments, two or more opening holes in the opening holes 232b (or opening holes 232a) may be distributed between every two adjacent opening holes in the opening holes 232a (or opening holes 232b), that is, the arrangement of the opening holes in the opening holes 232a (or the opening holes 232b) is sparser and the arrangement of the opening holes in the opening holes 232b (or the opening holes 232a) is denser.

Figure 6:
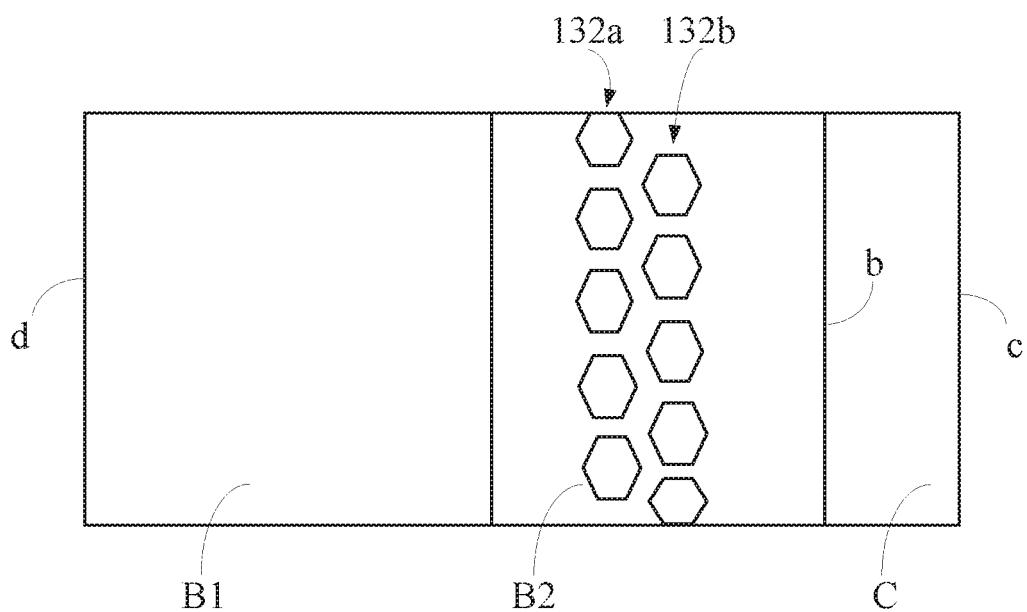
FIG. 6 is a schematic diagram of a distribution structure of the opening holes in the third embodiment of the disclosure.

Alternatively, as shown in FIG. 6, in the third implementation of step 3, different from the above embodiments, at least two rows of the opening holes form a plurality of X-shaped patterns sequentially connected to each other. The X-shaped pattern is shown as a dashed box in FIG. 6. In this embodiment, a plurality of X-shaped patterns is connected in a row. In other embodiments, two or more X-shaped patterns may be further connected, that is, two or more X-shaped patterns are formed in the horizontal direction in FIG. 5.

In step 4, the cutting area C of the first flexible large OLED panel is cut off, that is, all the layers in the cutting area C in FIG. 3 are cut off to obtain a second flexible large OLED panel (not shown). In this embodiment, the first flexible large OLED panel provided with the opening holes obtained after steps 1 to 3 is an entire flexible OLED motherboard, which needs to be cut into small flexible OLED panel as the semi-finished products through a cutting process (that is, the second flexible large OLED panel), where the cutting area C is the portion that is cut away. Specifically, the laser cutting process can be used for cutting. Since the laser cutting beam has a certain width, it is necessary to design an area having a certain width (i.e., the cutting area C) as a target region for laser irradiation. The width of the cutting area C (i.e., the spacing from the boundary b to the boundary c) may be set larger than the width of the laser cutting beam, and the difference between the two is within the tolerance range.

In step 5, the rigid substrate 11 in the second flexible large OLED panel is removed using a LLO technique. In this embodiment, the subsequent process may also be continued to finally obtain a flexible OLED panel.

In the prior art, when the rigid substrate 11 is peeled off by using the LLO technique, a portion of the second inorganic layer 132 near the boundary b of the second area B2 is prone to cracking, the crack substantially extends along a direction point to the display area D. The cracks will continue to spread over time and eventually spread to the display area D, affecting the normal display of the display area.

However, in the manufacturing method of this embodiment, the opening holes are firstly formed in a portion of the second inorganic layer 132 located in the second area B2, and then LLO is performed. Even though the crack will still occur during the LLO process, the crack can be prevented from being spread when reaching the opening holes due to the opening holes may release the cracking stress of the second inorganic layer 132, so that the defect of the crack may be prevented from being spread to the display area D. That is, the opening holes function as a role of blocking the crack diffusion by releasing the cracking stress. Further, the opening holes are arranged in at least two rows, and two of the rows of the opening holes adjacent to each other are arranged in a dislocation manner in the surrounding direction so as to distribute at least one of the opening holes on a line connecting any position on the boundary of the second area away from the first area to the display area, the diffusion of the cracks at any position in the second inorganic layer 132 can be blocked by at least one of the opening holes, thereby ensuring the crack at any position are not spread to the display area D, improving the manufacturing yield of the flexible OLED panel and enhancing the reliability of the flexible OLED panel.

In this embodiment, the reason why the second inorganic layer 132 does not cover the cutting area C is that the cutting area C is to be cut, while the excess thickness of the material layer affects the cutting quality of the cutting area C. Therefore, only the first inorganic layer 131 is formed in the cutting area C to play the role of ensuring the cutting quality and buffer isolation of the flexible base substrate 12. In other embodiments, the second inorganic layer may also cover the cutting area C.

Correspondingly, in step 3, each of the opening holes may only penetrate the second inorganic layer 132 or penetrate the second inorganic layer 132 and a part of the first inorganic layer 131. In this embodiment, a crack may occur on the first inorganic layer 131 and the second inorganic layer 132, and thus the opening holes may be formed on at least one of the two layers to stop crack diffusion.

The embodiment of the disclosure further provides a flexible OLED panel, which can be manufactured by the manufacturing method described in the above embodiments. In the FIGS. 3 to 6, the portion after all the material layers in the cutting area C are removed and the rigid substrate 11 is peeled off is the flexible OLED panel of this embodiment. The flexible OLED panel of this embodiment will be described below with reference to FIGS. 1 to 6.

As shown in FIG. 1, the flexible OLED panel 10 of this embodiment includes a display area D and a frame area B surrounding the periphery of the display area D. A display device (such as a TFT device and an OLED device) may be distributed in the display area D for displaying a picture. The display area D has a boundary d (the boundary d is also a common boundary between the display area D and the frame area B). The frame area B is a non-display area, and a driving circuit, a sealant, and the like can be arranged. The frame area B has a boundary b, and the frame area B surrounds the outer periphery of the display area D one turn.

As shown in FIG. 3, the frame area B includes a first area B1 and a second area B2 connecting to a second area B2, the second area B2 is arranged around the outer periphery of the first area B1, the first area B1 is connected to the display area D. It can also be seen from FIG. 3 that the first area B1 is located in the innermost layer of the frame area B, and the boundary d of the display area D is also the left boundary of the first area B1.

In conjunction with FIGS. 1 and 3, the flexible OLED panel 10 includes a flexible base substrate 12 and the inorganic layer 13 disposed on the flexible base substrate 12, the flexible base substrate 12 and the inorganic layer 13 both cover the display area D, the first area B1, and the second area B2. That is, any one of the flexible base substrate 12 and the inorganic layer 13 is distributed in the display area D, the first area B1, the second area B2. It should be understood that the display area D is not shown in FIG. 3, but in fact, both the flexible base substrate 12 and the inorganic layer 13 are also distributed in the display area D. In this embodiment, a driving circuit may be disposed in the first area B1. The second area B2 serves as a stress buffer region for buffering and releasing the cracking stress, which will be described below.

In this embodiment, at least two rows of opening holes are formed in a portion of the inorganic layer 13 located in the second area B2. For example, two rows of the opening holes 132a and 132b are schematically shown in FIGS. 3 and 4. A connection line of each of the opening holes of each of the rows extends in a surrounding direction of the frame area B, the surrounding direction is a direction of the frame area B surrounding the display area D, that is, a girth direction of the frame area B. Two of the rows of the opening holes adjacent to each other are arranged in a dislocation manner in the surrounding direction so as to distribute at least one of the opening holes on a line connecting any position on the boundary b of the second area B2 away from the first area B1 to any position of the display area D. In this embodiment, it should be understood that, in order to prevent the flexible base substrate 12 from being exposed to volatilize the organic substance to cause pollution, the opening holes on the inorganic layer 13 should be blind holes instead of through holes.

Specifically, as shown in FIG. 4, in a first embodiment, two rows of the opening holes 132a and 132b may be formed, the opening holes 132a and 132b both include a plurality of opening holes arranged at intervals from each other. Further, one of the opening holes 132b is distributed between every two adjacent opening holes of the opening holes 132a while one of the opening holes 132a is distributed between every two adjacent opening holes of the opening holes 132b so as to distribute at least one of the opening holes on a line connecting the any position on the boundary b to any position of the display area D, so as to achieve the description of "two of the rows of the opening holes adjacent to each other are arranged in a dislocation manner in the surrounding direction so as to distribute at least one of the opening holes on a line connecting any position on the boundary of the second area away from the first area to any position of the display area". In this embodiment, the opening holes may be hexagons. Actually, the opening holes may also be other shapes, such as circles, squares, and the like. In other embodiments, two or more opening holes in the opening holes 132b (or opening holes 132a) may be distributed between every two adjacent opening holes in the opening holes 132a (or opening holes 132b), that is, the arrangement of the opening holes in the opening holes 132a (or the opening holes 132b) is sparser and the arrangement of the opening holes in the opening holes 132b (or the opening holes 132a) is denser.

Alternatively, as shown in FIG. 5, in the second embodiment, two rows of opening holes 232a and 232b may be formed. Different from the above embodiment, each of the opening holes 232a and 232b is sequentially connected, and one of the opening holes 232b is distributed between every two adjacent opening holes of the opening 232a, and one of the opening holes 232a is distributed between every two adjacent opening holes 232b. In the present embodiment, the connection of the opening holes means that the opening holes are connected to each other. In other embodiments, two or more opening holes in the opening holes 232b (or opening holes 232a) may be distributed between every two adjacent opening holes in the opening holes 232a (or opening holes 232b), that is, the arrangement of the opening holes in the opening holes 232a (or the opening holes 232b) is sparser and the arrangement of the opening holes in the opening holes 232b (or the opening holes 232a) is denser.

Alternatively, as shown in FIG. 6, in the third embodiment, different from the above embodiments, the at least two rows of opening holes form a plurality of X-shaped patterns sequentially connected to each other. The X-shaped pattern is shown as a dashed box in FIG. 6. In this embodiment, a plurality of X-shaped patterns is connected in a row. In other embodiments, two or more X-shaped patterns may be further connected, that is, two or more X-shaped patterns are formed in the horizontal direction in FIG. 6.

In the prior art, a portion of the inorganic layer 13 near the boundary b of the second area B2 is prone to cracking, the crack substantially extends along a direction point to the display area D. The cracks will continue to spread over time and eventually spread to the display area D, affecting the normal display of the display area D.

However, in the proposal of this embodiment, even though the crack will still occur during the LLO process, the crack can be prevented from being spread when reaching the opening holes due to the opening holes may release the cracking stress of the second inorganic layer 132, so that the defect of the crack may be prevented from being spread to the display area D. That is, the opening holes function as a role of blocking the crack diffusion by releasing the cracking stress. Further, two of the rows of the opening holes adjacent to each other are arranged in a dislocation manner in the surrounding direction so as to distribute at least one of the opening holes on a line connecting any position on the boundary of the second area away from the first area to the display area, the diffusion of the cracks at any position in the inorganic layer 13 can be blocked by at least one of the opening holes, thereby ensuring the crack at any position are not spread to the display area, enhancing the reliability of the flexible OLED panel.

In this embodiment, further, the inorganic layer 13 may include a first inorganic layer 131 and a second inorganic layer 132. The first inorganic layer 131 and the second inorganic layer 132 both cover the first area B1 and the second area B2. It should be understood that the first inorganic layer 131 and the second inorganic layer 132 may actually include a plurality of laminated inorganic material layers by multiple material depositions. Correspondingly, the at least two rows of opening holes are formed in a portion of the second inorganic layer 132 located in the second area B2, the opening holes only penetrate the second inorganic layer 132 or penetrate the second inorganic layer 132 and a part of the first inorganic layer 131. In this embodiment, a crack may occur on the first inorganic layer 131 and/or the second inorganic layer 132, and thus the opening holes may be formed on at least one of the two layers to stop crack diffusion.

In this embodiment, by further forming the first inorganic layer 131 and the second inorganic layer 132, a specific inorganic layer deposition method is provided, which can well buffer and isolate the flexible base substrate 12 and improve the reliability of the flexible OLED panel.

The embodiment of the disclosure further provides an OLED display (not shown), including the above flexible OLED panel. The OLED display of this embodiment has high reliability.

Above are only embodiments of the disclosure, is not patented and therefore limit the scope of the disclosure, the use of any content of the present specification and drawings made equivalent or equivalent structural transformation process, either directly or indirectly related to the use of other technologies areas are included in the same way the scope of the patent protection of the disclosure. Accordingly, the scope of protection of the disclosure is subject to the scope of protection of the claims.

What is claimed is:

1. A flexible OLED panel, comprising:
a display area;
a frame area surrounding a periphery of the display area;
wherein the frame area comprises a first area and a second area connected to each other, and a side of the first area away from the second area is connected to the display area; the flexible OLED panel comprises a flexible base substrate and an inorganic layer disposed on the flexible base substrate, the flexible base substrate and the inorganic layer are both distributed in the display area, the first area, and the second area;
wherein at least two rows of opening holes are formed in a portion of the inorganic layer located in the second area, wherein a connection line of each of the opening holes of each of the rows extends in a surrounding direction of the frame area and two of the rows of the opening holes adjacent to each other are arranged in a dislocation manner in the surrounding direction so as to distribute at least one of the opening holes on a line connecting any position on a boundary of the second area away from the first area to any position of the display area,
wherein the opening holes are disposed on the inorganic layer and are blind holes such that the flexible base substrate is prevented from being exposed through the opening holes.

2. The flexible OLED panel according to claim 1, wherein each of the opening holes of each of the rows is arranged at intervals from each other; in two of the rows of the opening holes adjacent to each other, at least one of the opening holes of one of the rows is distributed between each two of the opening holes adjacent to each other of another one of the rows.

3. The flexible OLED panel according to claim 1, wherein each of the opening holes in each of the rows is connected in sequence; in two of the rows of the opening holes adjacent to each other, at least one of the opening holes of one of the rows is distributed between each two of the opening holes adjacent to each other of another one of the rows.

4. The flexible OLED panel according to claim 1, wherein the at least two rows of the opening holes form a plurality of X-shaped patterns sequentially connected to each other.

5. A display, comprising:
the flexible OLED panel according to claim 1.

6. The display according to claim 5, wherein each of the opening holes of each row is arranged at intervals from each other; in two of the rows of the opening holes adjacent to each other, at least one of the opening holes of one of the rows is distributed between each two of the opening holes adjacent to each other of another one of the rows.

7. The display according to claim 5, wherein each of the opening holes in each of the rows is connected in sequence; in two of the rows of the opening holes adjacent to each other, at least one of the opening holes of one of the rows is distributed between each two of the opening holes adjacent to each other of another one of the rows.

8. The display according to claim 5, wherein the at least two rows of the opening holes form a plurality of X-shaped patterns sequentially connected to each other.

* * * * *